US008410874B2

(12) United States Patent
Song et al.

(10) Patent No.: US 8,410,874 B2
(45) Date of Patent: Apr. 2, 2013

(54) VERTICAL QUASI-CPWG TRANSMISSION LINES

(75) Inventors: Yupeng Song, Fremont, CA (US); Yanyang Zhao, Fremont, CA (US); Yuheng Lee, San Jose, CA (US); Jianying Zhou, Acton, MA (US)

(73) Assignee: Finisar Corporation, Sunnyvale, CA (US)

( * ) Notice: Subject to any disclaimer, the term of this patent is extended or adjusted under 35 U.S.C. 154(b) by 267 days.

(21) Appl. No.: 12/849,629

(22) Filed: Aug. 3, 2010

(65) Prior Publication Data

US 2012/0032752 A1 Feb. 9, 2012

(51) Int. Cl.
*H03H 7/38* (2006.01)
*H01P 1/00* (2006.01)

(52) U.S. Cl. .......................................... 333/247; 333/33

(58) Field of Classification Search .................... 333/33, 333/246, 238, 247, 254, 260
See application file for complete search history.

(56) References Cited

U.S. PATENT DOCUMENTS 6,980,068 B2 * 12/2005 Miyazawa et al. ............ 333/260
2008/0191818 A1 * 8/2008 Lee et al. ....................... 333/247

* cited by examiner

*Primary Examiner* — Stephen Jones
(74) *Attorney, Agent, or Firm* — Maschoff Brennan

(57) ABSTRACT

In one example embodiment, a coplanar waveguide signal transition element transitions high-speed signals between vertically stacked coplanar waveguide transmission lines. The signal transition element comprises one or more dielectric layers and a plurality of electrically conductive vias extending through at least a portion of the one or more dielectric layers. The vias include one or more signal vias and one or more ground vias that are configured to transition signals between the vertically stacked coplanar waveguide transmission lines. The signal transition element also comprises a ground plane disposed within the one or more dielectric layers and electrically coupled to the one or more ground vias. The ground plane has one or more openings through which the one or more signal vias respectively pass.

20 Claims, 6 Drawing Sheets

VERTICAL QUASI-CPWG TRANSMISSION LINES

BACKGROUND OF THE INVENTION

1. Field of the Invention

The present invention generally relates to electrical interconnects in high-speed circuits. In particular, some example embodiments relate to vertical via interconnects between coplanar waveguide (CPWG) transmission lines in high-speed transponders.

2. Related Technology

Due to process technology limits and other design challenges, cheap and efficient packaging of components in high-speed circuits, such as high-speed transponders, is difficult. Bulky, expensive, interconnections are instead frequently relied on. Such interconnections include coaxial cable and microwave/radio frequency (RF) connectors, such as GPPO or V-connectors. In addition to their high cost and space consumption, such cables and connectors introduce complexity in component packaging.

Coaxial cables and their associated connectors can be eliminated by using vertical high-speed interconnects, but not without introducing other design challenges. For example, typical vertical high-speed interconnects critically degrade performance by introducing transmission losses, reflection losses, electromagnetic interference, and reduced bandwidth, among other things. Relatively large pad pitches (e.g., 0.8 mm or more) is a typical design constraint for vertical high-speed interconnects in multi-layer surface-mounted packages, whereby correspondingly large losses in signal quality are introduced. Thus, no satisfactory technology exists for replacing coaxial cables and RF connectors with surface-mountable vertical interconnects in high-speed circuits.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF THE INVENTION

In general, example embodiments of the invention relate to vertical high-speed interconnects for conveying electrical signals between coplanar waveguide transmission lines. The coplanar waveguide transmission lines may transmit signals between, for example, integrated circuits (ICs) and/or opto-electric circuits (OCs) and packages that include ICs and/or OCs.

In one example embodiment, a coplanar waveguide signal transition element transitions high-speed signals between vertically stacked coplanar waveguide transmission lines. The signal transition element comprises one or more dielectric layers and a plurality of electrically conductive vias extending through at least a portion of the one or more dielectric layers. The vias include one or more signal vias and one or more ground vias that are configured to transition signals between the vertically stacked coplanar waveguide transmission lines. The signal transition element also comprises a ground plane disposed within the one or more dielectric layers and electrically coupled to the one or more ground vias. The ground plane has one or more openings through which the one or more signal vias respectively pass.

The signal transition element configured with a ground plane having one or more openings overcomes many of the shortcomings of prior art vertical interconnects by mimicking conventional grounded CPWG transmission lines. Conventional grounded CPWG transmission lines are suitable for routing signals only in a planar surface. However, the proposed signal transition element is suitable for vertical transitions among different layers of CPWG transmission lines. For example, the proposed signal transition element can be employed in connecting one set of planar CPWG transmission lines in one layer of a package to another set of planar CPWG transmission lines in a different layer of the same or a different package. The one or more openings in the ground plane through which the one or more signal vias respectively pass provide smooth electromagnetic mode transitions from a set of planar CPWG transmission lines to the vertical signal vias.

In another example embodiment, a circuit comprises a printed circuit board (PCB), a first set of coplanar waveguide transmission lines disposed on the PCB, a vertical transition component mounted on the PCB, a ground plane disposed within the vertical transition component, and an integrated circuit mounted on the vertical transition component so as to be in electrical contact with a second set of coplanar waveguide transmission lines. The vertical transition component has electrically conductive vias extending through at least a portion of the vertical transition component, the vias being configured to transition signals between the first set of coplanar waveguide transmission lines and the second set of coplanar waveguide transmission lines arranged in a plane separate from that of the first set of coplanar waveguide transmission lines. In addition, the ground plane is electrically coupled to a first set of one or more of the vias and has one or more openings through which a second set of one or more of the vias pass.

Additional features of the invention will be set forth in the description which follows, and in part will be obvious from the description, or may be learned by the practice of the invention. The features of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Reference will now be made to the figures wherein like structures will be provided with like reference designations. It is understood that the figures are diagrammatic and schematic representations of presently preferred embodiments of the invention, and are not limiting of the present invention, nor are they necessarily drawn to scale.

FIGS. 1-6 disclose various aspects of some example embodiments of the invention. The embodiments described herein may provide, among other things, a space-efficient and inexpensive way to connect high-speed electrical signals between integrated circuits (ICs) and/or optoelectric circuits (OCs). The term "high-speed" as used herein refers to data rates of about 15 GHz or above. For example, the term "high-speed" as used herein encompasses a data rate of between about 40 GHz and 100 GHz. The high-speed electrical signals may be transferred between packages that include ICs and/or OCs via horizontal transmission lines on a printed circuit board (PCB) and via vertical interconnects and other connections disposed between packages and the horizontal PCB transmission lines. Vertical interconnects consistent with embodiments of the invention are also referred to herein as vertical vias or as quasi-CPWG transmission lines or vertical transition interconnects in a CPWG signal transition component or element because they mimic the function of horizontal CPWG transmission lines.

Example embodiments of vertical interconnects disclosed herein are configured such that standard package configurations can be employed, obviating the need for specialized IC and OC packages commonly used in high-speed transponders, such as GPPO equipped packages. Additionally, example high-speed vertical interconnects disclosed herein are scalable such that high-speed data rates, such as 40 GHz, 100 GHz, or higher, can be accommodated. Thus, the example high-speed vertical interconnects disclosed herein can be employed to simplify the complexity of transponder design while enabling transfer of high-speed signals between the transponder's constituent packages. The example vertical interconnects disclosed herein are less expensive, and therefore have better market potential, than interconnects that employ relatively more expensive coaxial cable and GPPO or V-connectors. Some example vertical interconnects disclosed herein can also improve space efficiency within a high-speed transponder.

Figure 1:
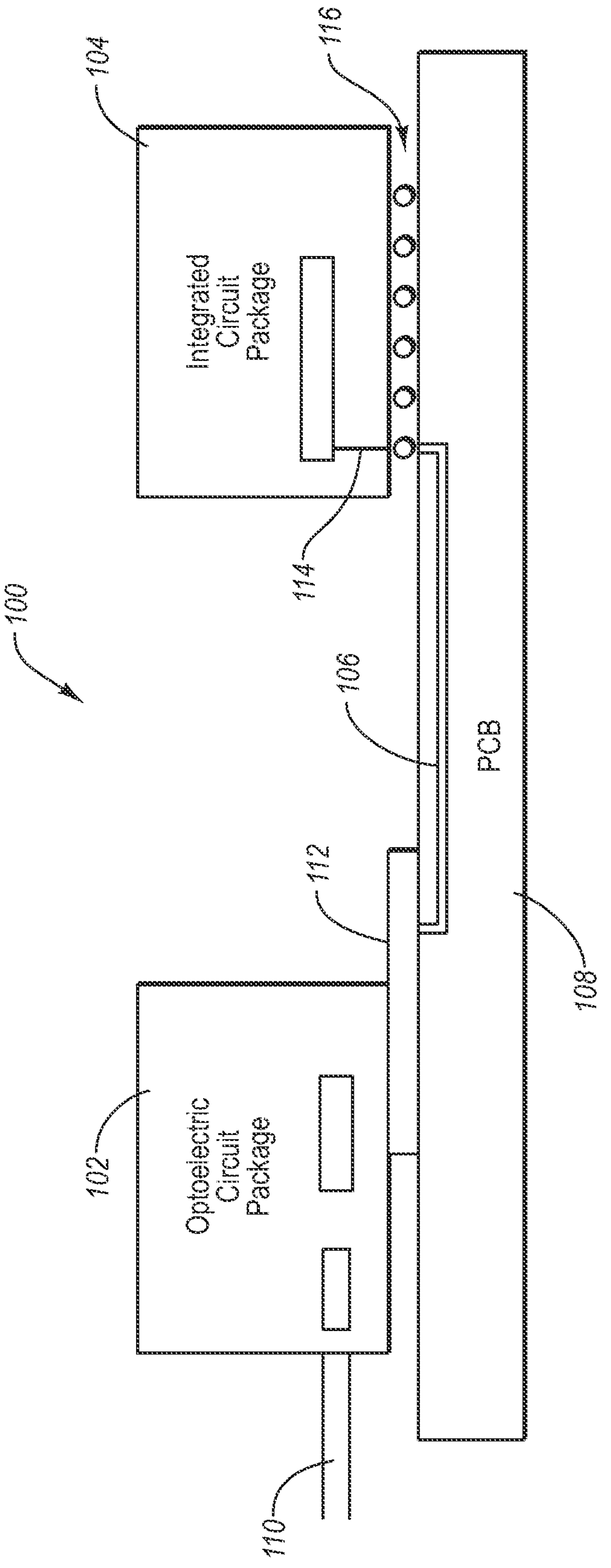
FIG. 1 is a simplified block diagram of a high-speed transponder in which an embodiment of the invention may be used.

With reference to FIG. 1, an example application in which vertical interconnects can be used to transfer high-speed signals between packages in a high-speed transponder 100 is disclosed. An OC package 102 interfaces with an IC package 104 via RF traces 106 in a PCB 108 and various intermediate connections. OC package 102 transmits and/or receives optical signals to/from an external circuit or device through a fiber 110 and transmits and/or receives high-speed electrical signals through intermediate connections 112, which may be conductors in a flex circuit or leads designed for routing high-speed electrical signals to and from RF traces 106. OC package 102 may integrate various optoelectronic components such as a laser, a photodiode, a transimpedance amplifier, a laser driver, etc.

IC package 104 transmits and/or receives high-speed electrical signals to and/or from RF traces 106 through vertical interconnects 114 and a surface mount interface 116. Surface mount interface 116 may be, for example, an array of solder joints such as a ball grid array (BGA), a pin grid array (PGA), a land grid array (LGA), or the like. IC package 104 may integrate various components such as a multiplexer/demultiplexer, a serializer/deserializer, and a clock and data recovery circuit, among other things. The vertical interconnects 114 can be implemented using aspects of quasi-CPWG transmission line technology, which mimics transmissions over horizontal CPWG transmission lines and is disclosed in more detail with reference to FIGS. **2*b* and 3-6** below.

Figure 2A:
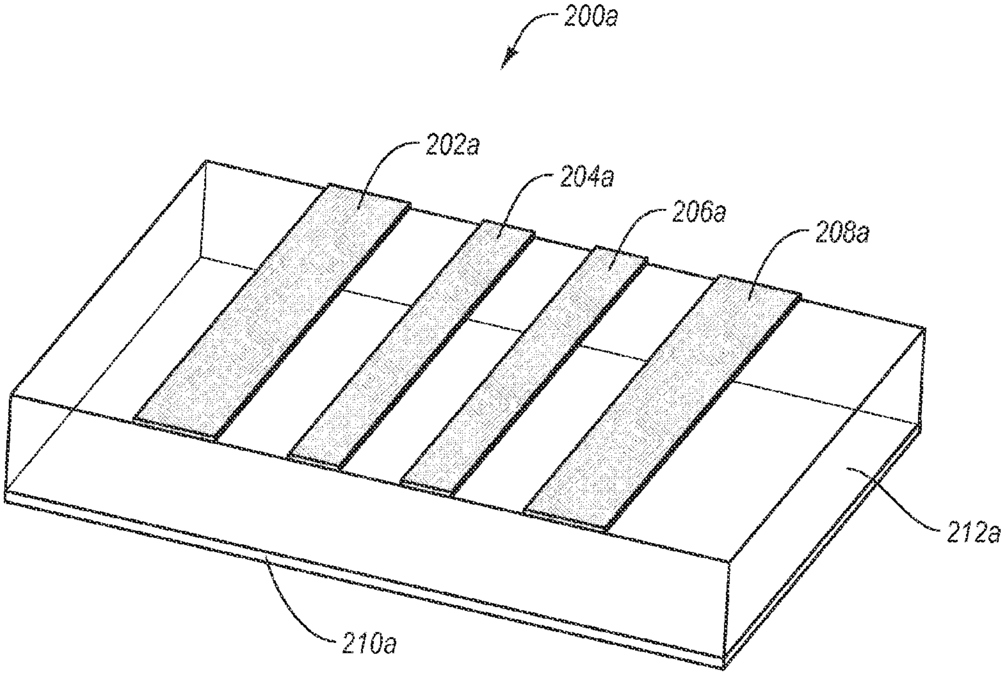
FIG. 2A is a perspective view of CPWG transmission lines for differential signals.

With reference now to FIG. 2A, an example set of CPWG transmission lines **200*a* for transmission of differential signals is disclosed. The set of CPWG transmission lines for differential signals 200*a* includes two signal traces 204*a* and 206*a*, two side-ground traces 202*a* and 208*a*, a ground plane 210*a*, and a substrate 212*a*. Signal traces 204*a*, 206*a*, side-ground traces 202*a*, 208*a*, and ground plane 210*a* may be composed of electrically conductive materials, while substrate 212 may be composed of a dielectric material. CPWG transmission lines 200*a* may be used to implement RF traces 106 in FIG. 1 to route signals between OC package 102 and IC package 104**.

With reference now to FIG. **2*b*, an example CPWG signal transition component or element 200*b* includes a set of quasi-CPWG transmission lines or vertical vias (or vertical interconnects) for transmission of differential signals. The vertical vias in CPWG signal transition component 200*b* include two signal vias 204*b* and 206*b*, two side-ground vias 202*b* and 208*b*, two back-ground vias 210*b* and 212*b*, and a substrate 214*b*. The vertical vias can be employed in a high-speed application as a vertical transition connecting a first set of transmission lines to a second set of transmission lines, for example, on first and second layers of a multi-layer package. Comparing the transmission lines 200*a* in FIG. 2A with the vertical vias of FIG. 2*b*, it can be seen that signal traces 204*a* and 206*a* in CPWG transmission lines 200*a* functionally correspond to signal vias 204*b* and 206*b* in CPWG signal transition component 200*b*; side-ground traces 202*a* and 208*a* functionally correspond to side-ground vias 202*b* and 206*b*; ground plane 210*a* functionally corresponds to back-ground vias 210*b* and 212*b*; and substrate 212*a* functionally corresponds to substrate 214*b*. Therefore, the vertical vias of CPWG signal transition component 200*b* may be said to mimic the transmission function of transmission lines 200*a***.

The signal vias **204*b*, 206*b*, and side-ground vias 202*b* and 206*b* are substantially aligned in a first y-z plane, while back-ground vias 210*b*, 212*b* are arranged in a second y-z plane offset from but parallel to the first y-z plane. Moreover, back-ground vias 210*b*, 212*b* may be disposed in the second y-z plane such that a distance between the ground via 210*b* and signal via 204*b* is minimized and a distance between ground via 212*b* and signal via 206*b* is minimized. Because the second plane is parallel to the first plane, the distance from back-ground via 210*b* to signal via 204*b* is equal to the distance from back-ground via 212*b* to signal via 206*b*. In addition, these via to via distances may be equal to the distance between side-ground via 202*b* and signal via 204*b* and the distance between side-ground via 208*b* and signal via 206*b*. The distance between signal vias 204*b* and 206*b* and the distance between back-ground vias 210*b* and 212*b*** may also be equal to the other neighboring via distances. Thus, the distance between any two neighboring vias may be equal and may be minimized, within pad pitch design constraints, to preserve signal energy.

Figure 2B:
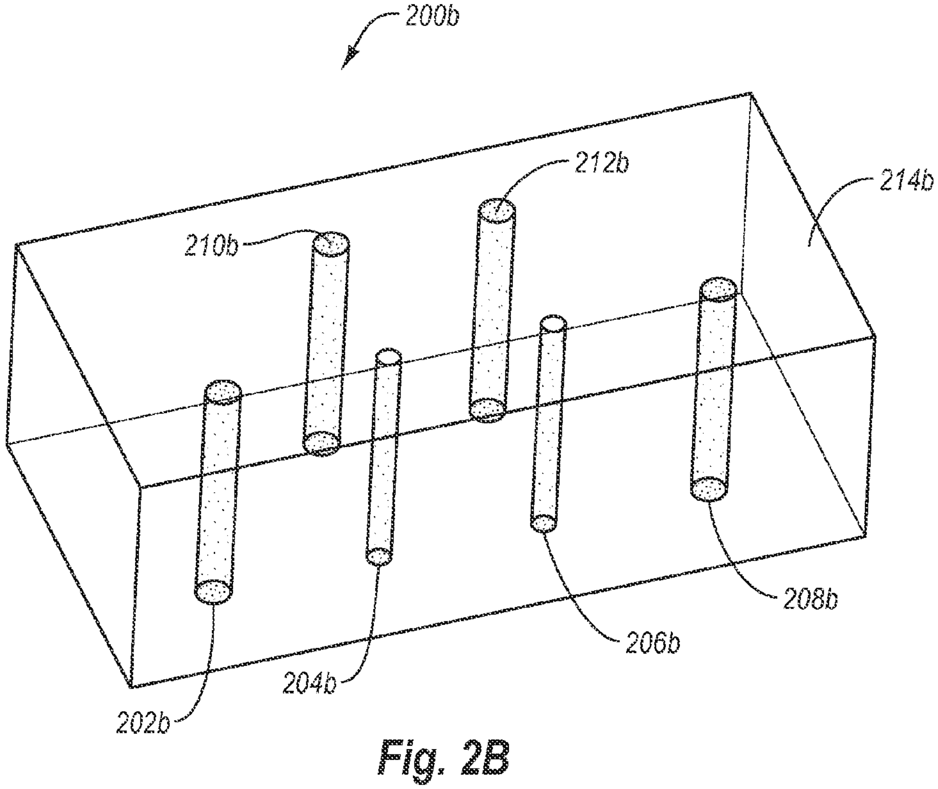
FIG. 2B is a perspective view of quasi-CPWG transmission lines for differential signals consistent with an embodiment of the invention.
Figure 3:
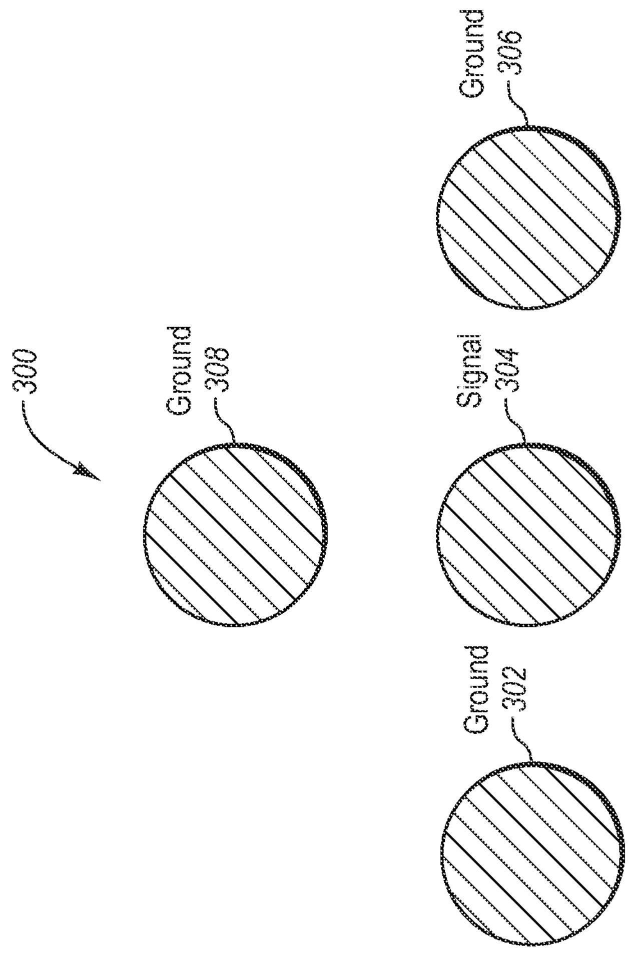
FIG. 3 is a top view of quasi-CPWG transmission lines for single-ended signals consistent with an embodiment of the invention.

Although the example embodiments shown in FIGS. 2A and 2B function to transmit differential signals, a single-ended version is also contemplated in which a single signal transmission line and a corresponding single signal via are implemented. For example, with reference now to FIG. 3, an example CPWG signal transition component for single-ended transmissions 300 includes quasi-CPWG transmission lines, i.e. vertical vias, for transmission of a single-ended signal. The single-ended vertical vias include a single signal via 304 and two side-ground vias 302 and 306, arranged in a first plane, and a back-ground via 308 arranged in a second plane offset from the first plane. As with the neighboring via distances in FIG. 2B, the distance between each neighboring pair of vertical vias in the single-ended embodiment of FIG. 3 may also be equal. Moreover, although the diameters of all vias in FIG. 3 are depicted as being equal, the diameters may vary. For example, each of side-ground vias 302, 306 and back-ground via 308 may have a first diameter while signal via 304 may have a second diameter. Similarly, with respect to the vias in FIG. 2B, each of the side-ground vias 202*b*, 208*b*, and back-ground vias 210*b*, 212*b* may have a first diameter, while differential signal vias 204*b*, 206*b* may have a second diameter. Each of the via diameters may be selected so as to optimize efficiency of signal transmission using, e.g., standard optimization techniques.

The vertical via for single-ended signals mimics a partially grounded conventional planar CPWG transmission line for single-ended signals. The vertical vias for single-ended signals can be employed in a high-speed application as a vertical transition connecting a first set of singled-ended CPWG transmission lines to a second set of single-ended CPWG transmission lines. The first set and second set of single-ended CPWG transmission lines can be arranged, for example, on first and second layers of a multi-layer package.

Figure 4:
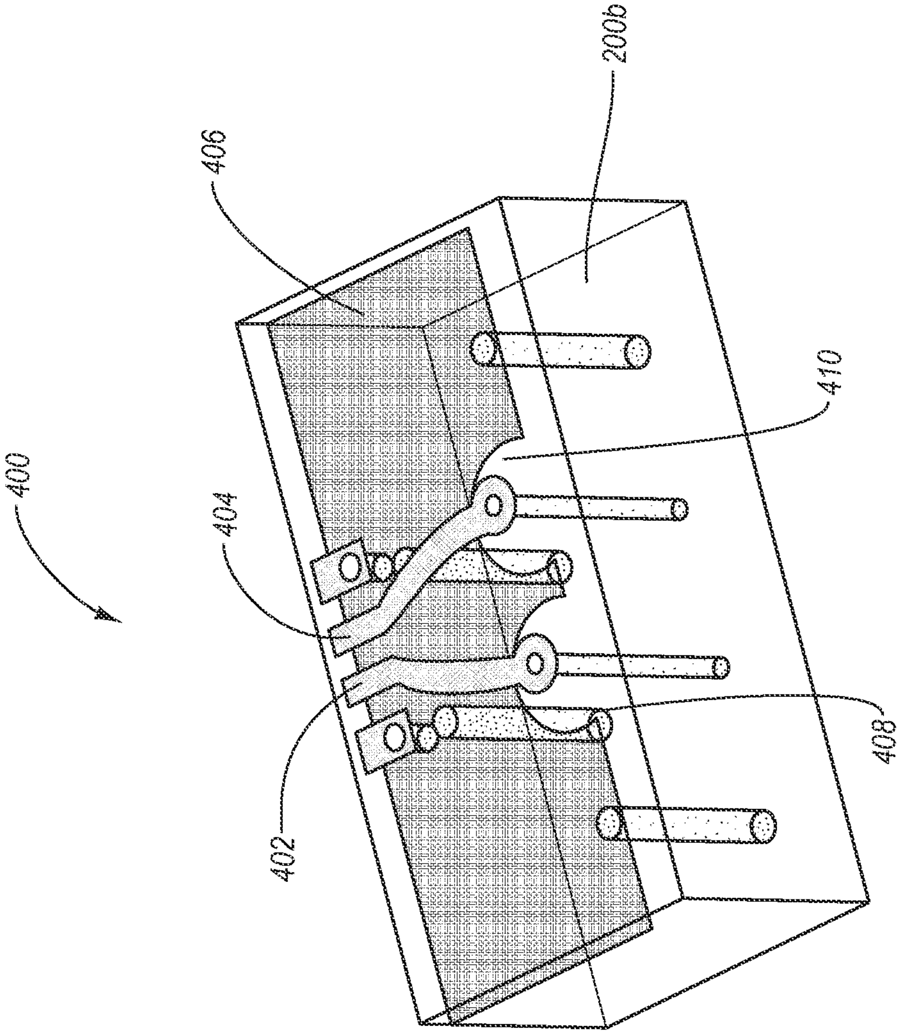
FIG. 4 is a perspective view of quasi-CPWG transmission lines with ground openings on an intermediate ground plane.

With reference now to FIG. 4, a perspective view depicts a CPWG signal transition component 400 with an intermediate ground plane 406 disposed within a dielectric substrate material and ground cutouts or openings 408 and 410 on intermediate ground plane 406. CPWG signal transition component 400 has vertical vias corresponding to those of CPWG signal transition component 200*b* in FIG. 2B. Ground openings 408, 410 are formed around vertical vias corresponding to signal vias 204*b*, 206*b* of CPWG signal transition component 200*b* in FIG. 2B. Signal vias 204*b*, 206*b* extend through ground openings 408, 410 to CPWG transmission lines 402 and 404 disposed on a top surface of CPWG signal transition component 400. The other vias (ground vias 202*b*, 208*b*, 210*b*, and 212*b*), on the other hand, do not extend through intermediate ground plane 406, but instead are electrically coupled to intermediate ground plane 406. Moreover, intermediate ground plane 406 is parallel to the top surface of CPWG signal transition component 400 and serves as a ground plane for transmission of signals along CPWG transmission lines 402 and 404. According to one embodiment, intermediate ground plan 406 is separated from the top surface of CPWG signal transition component 400 by a dielectric layer that is six mils thick.

Although ground openings 408, 410 are depicted as half-circles, the shape of one or both may vary. For example, the shape of ground openings 408, 410 may be ovoid or polygonal (e.g., having multiple sides corresponding to half of a regular polygon, such as a rectangle, hexagon, octagon, etc., or corresponding to irregular polygonal shapes having, e.g., jagged sides of equal or unequal lengths). The shape and dimensions of ground openings 408, 410 may be selected so as to optimize smoothness of mode transition from horizontal planar transmission to vertical transmission using, e.g., standard optimization techniques.

The dielectric material in CPWG signal transition component 400 may be a substantially monolithic dielectric element or, as in one example embodiment, may comprise one or more high temperature co-fired ceramic (HTCC) layers. For example, a first HTCC layer may be disposed between intermediate ground plane 406 and CPWG transmission lines 402 and 404. One or more additional HTCC layers may be disposed below intermediate ground plane 406. The HTCC layers may incorporate other vertical vias (not shown), as well as horizontally disposed signal traces (not shown) to provide interconnections with other components and terminals in integrated circuit package 104.

Figure 5:
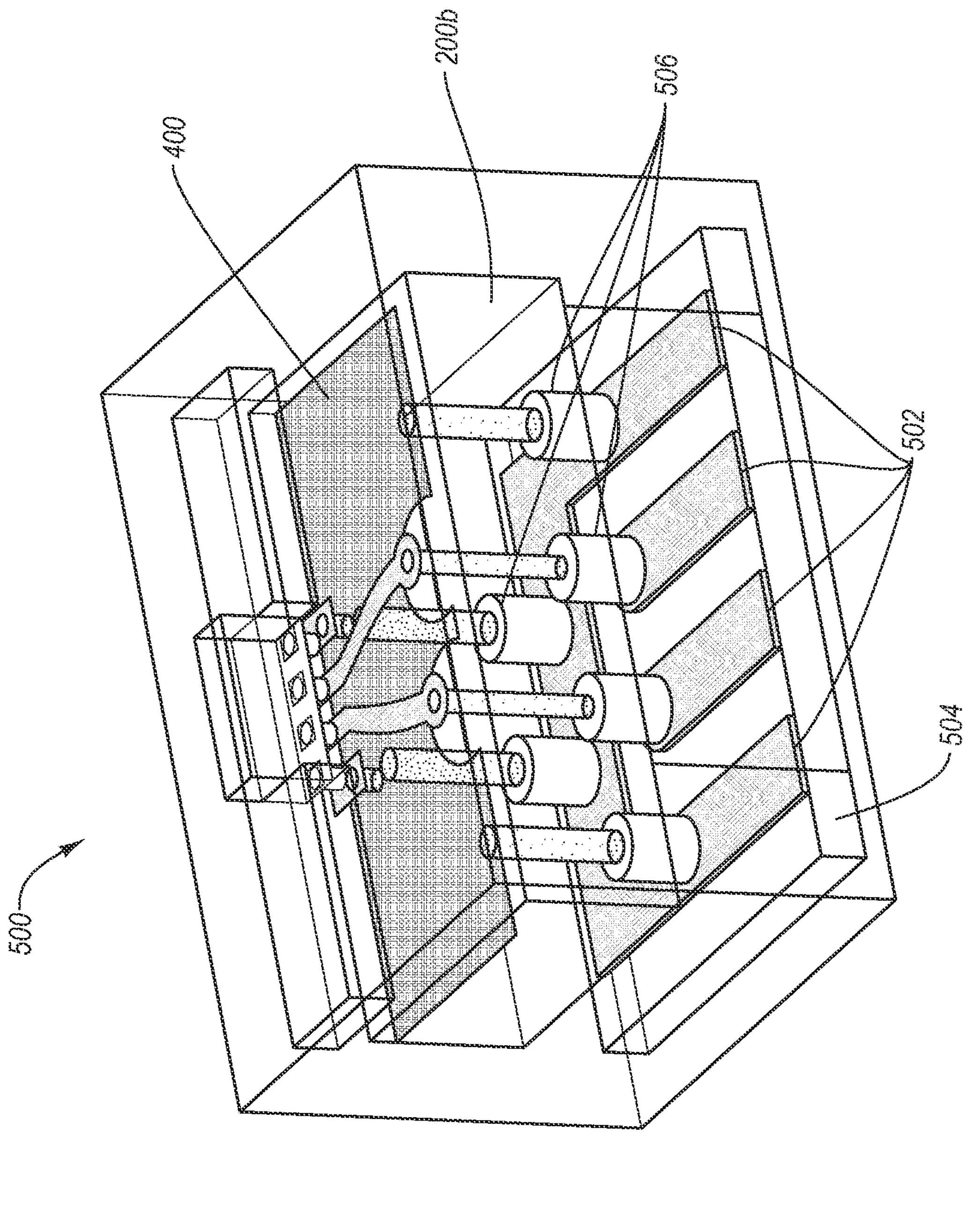
FIG. 5 is a perspective view of the quasi-CPWG transmission lines of FIG. 4 employed in a high-speed multi-layer IC package.

FIG. 5 is a perspective view of the example CPWG signal transition component 400 of FIG. 4 integrated with other components in an example high-speed multi-layer integrated circuit package 500. As disclosed in FIG. 5, one end of CPWG signal transition component 400 is connected to a first set of CPWG transmission lines 402 and 404 disposed on the top surface of CPWG signal transition component 400. The other end of CPWG signal transition component 400 is connected to a second set of CPWG transmission lines 502 on another layer (e.g., PCB layer 504) via BGA joints 506 (or another surface mount interface, such as PGA or LGA joints). A distance between the first set of CPWG transmission lines 402 and 404 may be tapered (as shown) or widened to interface with other surface-mountable components mounted thereto, which may have a narrower (as shown) or wider pad pitch. Alternatively or in addition, the first set of CPWG transmission lines 402 and 404 may interface with a third set of CPWG transmission lines (not shown) through another CPWG signal transition component (not shown) stacked above CPWG signal transition component 400. In addition, multi-layer package 500 may have multiple layers. In one embodiment, package 500 has six HTCC layers, for example. However, it is contemplated that the example vertical transition interconnects disclosed herein may also be implemented in multi-layer packages having less than or more than six layers.

Figure 6:
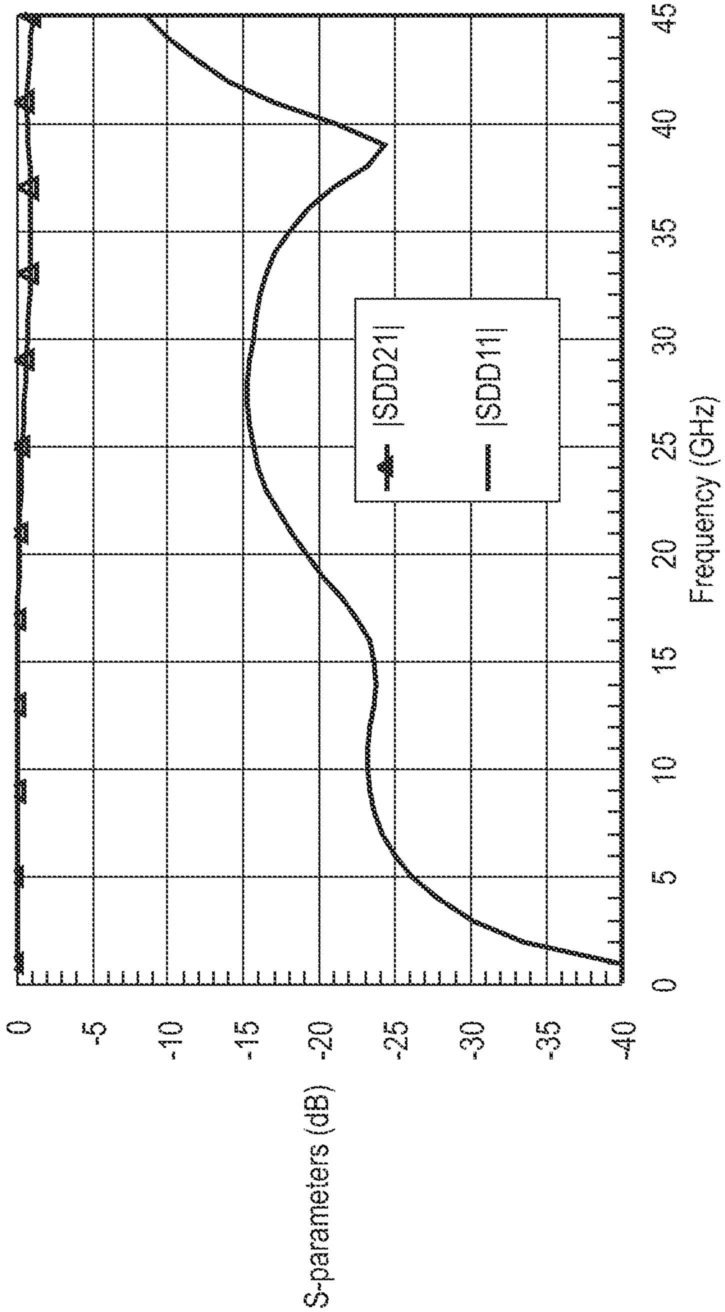
FIG. 6 is a plot of forward transmission (insertion loss) and reflection (return loss) characteristics of the quasi-CPWG transmission lines in FIG. 5.

FIG. 6 is a plot 600 showing the forward transmission (insertion loss S21) and reflection (return loss S11) characteristics of the quasi-CPWG transmission lines for differential signals in FIG. 5. As disclosed in FIG. 6, the example quasi-CPWG transmission line has a bandwidth up to 45 GHz.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A coplanar waveguide (CPWG) signal transition element that transitions high-speed signals between vertically stacked coplanar waveguide transmission lines comprising:

one or more dielectric layers;

a plurality of electrically conductive vias extending through at least a portion of the one or more dielectric layers, the vias including one or more signal vias and one or more ground vias that are configured to transition high-speed signals between the vertically stacked coplanar waveguide transmission lines, the vias disposed in a first plane including at least one ground via and a second plane including at least two ground vias and at least one signal via, wherein the first plane is substantially parallel to the second plane; and a ground plane disposed within the one or more dielectric layers and electrically coupled to the one or more ground vias, the ground plane having one or more openings through which the one or more signal vias respectively pass.

2. The CPWG signal transition element of claim 1, wherein the coplanar waveguide transmission lines are differential signal transmission lines having two signal transmission lines, and wherein the one or more signal vias include two differential signal vias corresponding to the two signal transmission lines.

3. The CPWG signal transition element of claim 1, wherein the one or more openings in the ground plane are circular, ovoid, or rectangular in shape.

4. The CPWG signal transition element of claim 1, wherein the one or more dielectric layers include a high temperature co-fired ceramic (HTCC) layer.

5. The CPWG signal transition element of claim 1, wherein the ground plane functions as a ground plane for coplanar waveguide transmission lines.

6. The CPWG signal transition element of claim 1, wherein the one or more dielectric layers include a plurality of signal traces disposed thereon.

7. The CPWG signal transition element of claim 1, wherein the one or more ground vias include three ground vias and the one or more signal vias include a single-ended signal via.

8. The CPWG signal transition element of claim 7, wherein a first one of the ground vias is disposed laterally in a first direction with respect to the single-ended signal via, wherein a second one of the ground vias is disposed laterally in a second direction, opposite the first direction, with respect to the single-ended signal via, and wherein a third one of the ground vias is disposed laterally in a third direction, normal to the first and second directions, with respect to the single-ended signal via.

9. The CPWG signal transition element of claim 1, wherein the one or more ground vias include four ground vias and the one or more signal vias include two differential signal vias.

10. The CPWG signal transition element of claim 9, wherein first and second ones of the four ground vias are disposed substantially aligned with the two differential signal vias in the second plane, and wherein third and fourth ones of the four ground vias are disposed in the first plane.

11. The CPWG signal transition element of claim 10, wherein the third and fourth ground vias are disposed in the first plane such that a distance between the third ground via and a first one of the two differential signal vias is minimized and a distance between the fourth ground via and a second one of the two differential signal vias is minimized.

12. Multiple-component circuitry comprising:

a printed circuit board (PCB);

a first set of CPWG transmission lines disposed on the PCB in a first plane;

a vertical transition component mounted on the PCB, the vertical transition component having electrically conductive vias extending through at least a portion of the vertical transition component, the vias being configured to transition signals between the first set of CPWG transmission lines and a second set of CPWG transmission lines arranged in a second plane separate from the first plane, the vias including a signal via, a side-ground via positioned a first distance from the signal via in a first direction, and a rear-ground via positioned a second distance from the signal via in a second direction that is substantially perpendicular to the first direction;

a ground plane disposed within the vertical transition component and electrically coupled to the side-ground via and the rear-ground via, the ground plane having one or more openings through which the signal via passes; and an integrated circuit mounted on the vertical transition component so as to be in electrical contact with the second set of coplanar waveguide transmission lines.

13. The multiple-component circuitry of claim 12, further comprising:

an optoelectric circuit in optical communication with an external circuit and in electrical communication with the first set of CPWG transmission lines on the PCB.

14. The multiple-component circuitry of claim 12, wherein the circuit is a high-speed transponder for optical and electrical communications.

15. The multiple component circuitry of claim 12, wherein the signal via comprises a single-ended via or a first of two differential signal vias.

16. The multiple-component circuitry of claim 12, further comprising a surface-mount interface that electrically interfaces the vias in the vertical transition component with corresponding electrical contacts on the PCB.

17. The multiple-component circuitry of claim 16, wherein the surface-mount interface includes a ball grid array, a pin grid array, or a land grid array.

18. A coplanar waveguide (CPWG) signal transition component configured to transition high-speed signals between a first set of CPWG transmission lines positioned in a first x-z plane on a top surface of the CPWG signal transition component and a second set of CPWG transmission lines positioned in a second x-z plane, the CPWG transition component comprising:

a dielectric layer;

one or more signal vias extending through the dielectric layer;

a ground plane disposed within the dielectric layer through which the one or more signal vias pass; and three or more ground vias extending through at least a portion of the dielectric layer from the ground plane to the second set of CPWG transmission lines, there being at least two more of the ground vias than of the one or more signal vias, at least two of the ground vias being side-ground vias and being aligned in a first y-z plane, at least one of the one or more signal vias also being aligned in the first y-z plane, and at least one of the ground vias being a rear-ground via and being positioned in a second y-z plane separate from the first y-z plane.

19. The CPWG signal transition component of claim 18, wherein the one or more signal vias comprises one single-ended via or two differential signal vias.

20. The CPWG signal transition element of claim 18, wherein the ground plane comprises openings the shape of which are selected to optimize smoothness of mode transition from horizontal planar transmission to vertical transmission.

* * * * *